(12) United States Patent
Pas

(10) Patent No.: US 8,114,728 B2
(45) Date of Patent: Feb. 14, 2012

(54) INTEGRATION SCHEME FOR AN NMOS METAL GATE

(75) Inventor: Michael Francis Pas, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/731,900

(22) Filed: Mar. 25, 2010

(65) Prior Publication Data

US 2010/0178739 A1    Jul. 15, 2010

Related U.S. Application Data

(62) Division of application No. 11/934,250, filed on Nov. 2, 2007.

(51) Int. Cl.
*H01L 21/8238* (2006.01)

(52) U.S. Cl. .................. 438/199; 257/E21.637

(58) Field of Classification Search .................. 438/199, 438/275; 257/392, E21.637, E27.064, E21.644
See application file for complete search history.

(56) References Cited

U.S. PATENT DOCUMENTS

| | | | |
|---|---|---|---|
| 6,087,231 A * | 7/2000 | Xiang et al. | 438/287 |
| 7,229,873 B2 * | 6/2007 | Colombo et al. | 438/231 |
| 7,642,153 B2 | 1/2010 | Pas | |
| 7,812,414 B2 * | 10/2010 | Hou et al. | 257/412 |

* cited by examiner

*Primary Examiner* — David Vu
(74) *Attorney, Agent, or Firm* — Warren L. Franz; Wade J. Brady, III; Frederick J. Telecky, Jr.

(57) ABSTRACT

A method for making an NMOS transistor on a semiconductor substrate includes reducing the thickness of the PMD layer to expose the polysilicon gate electrode of the NMOS transistor and the polysilicon gate electrode of the PMOS transistor, and then removing the gate electrode of the NMOS transistor. The method also includes depositing a NMOS-metal layer over the semiconductor substrate, depositing a fill-metal layer over the NMOS-metal layer, and then reducing the thickness of the NMOS metal layer and the fill metal layer to expose the gate electrodes of the NMOS transistor and the PMOS transistor.

17 Claims, 14 Drawing Sheets

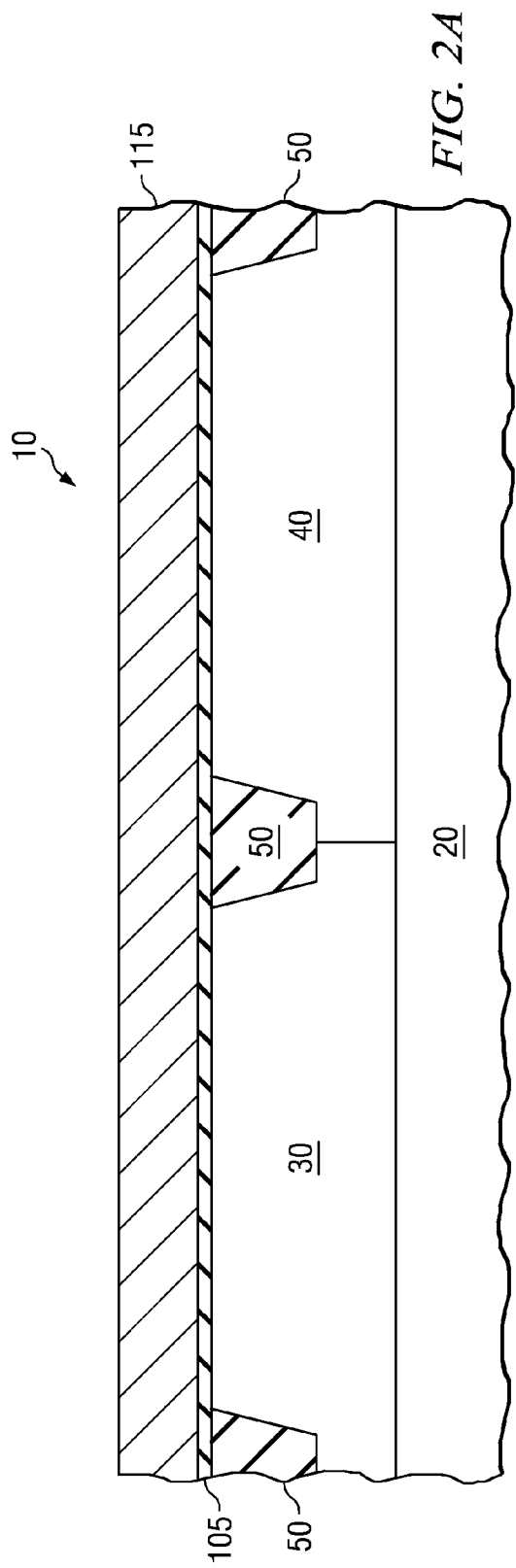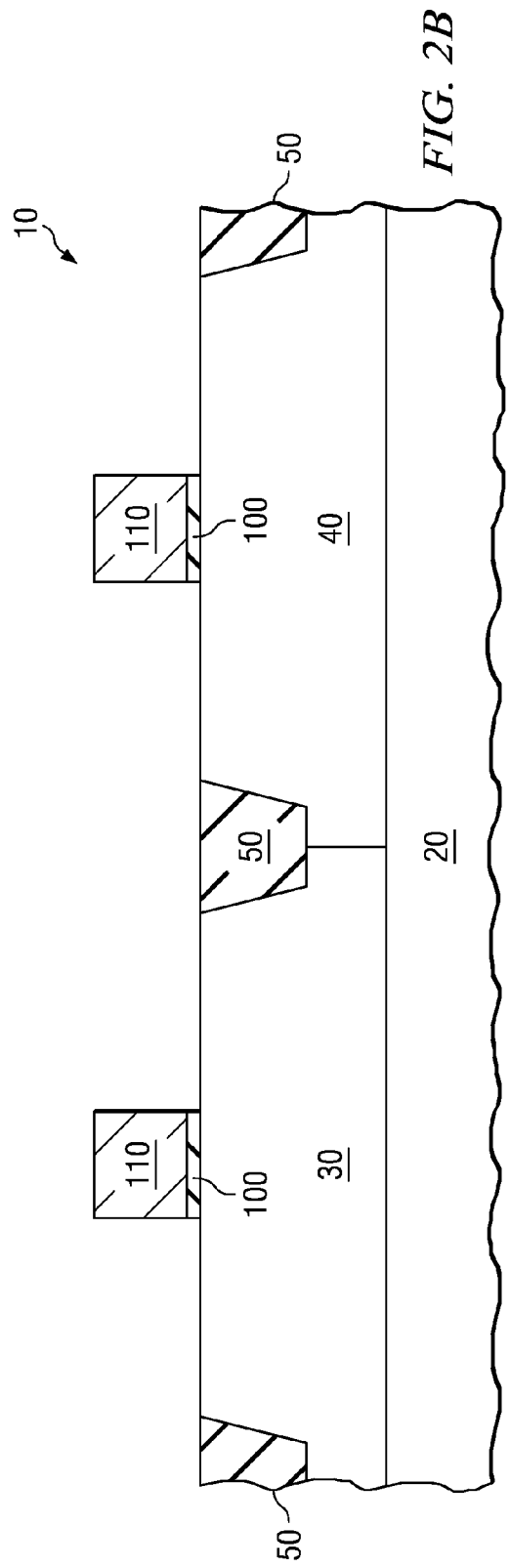

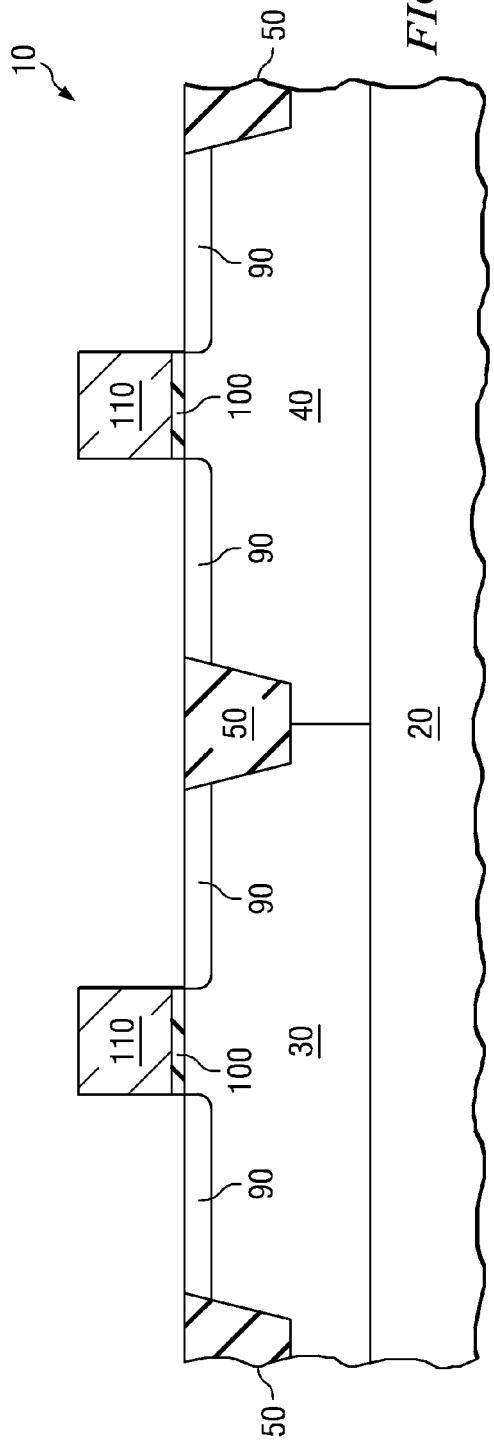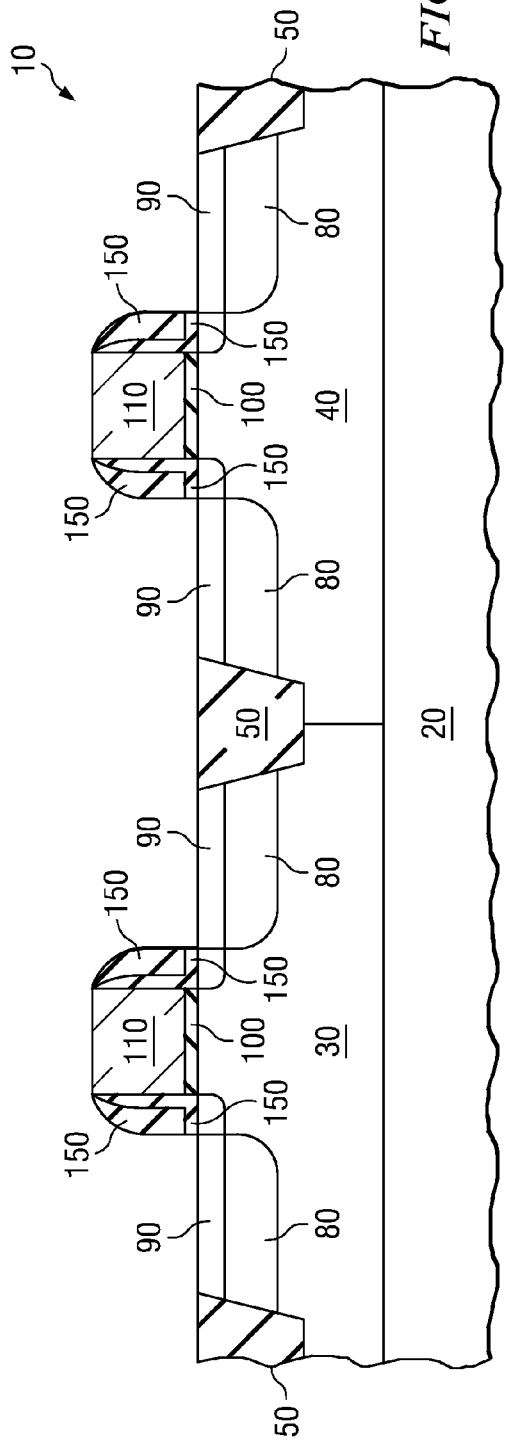

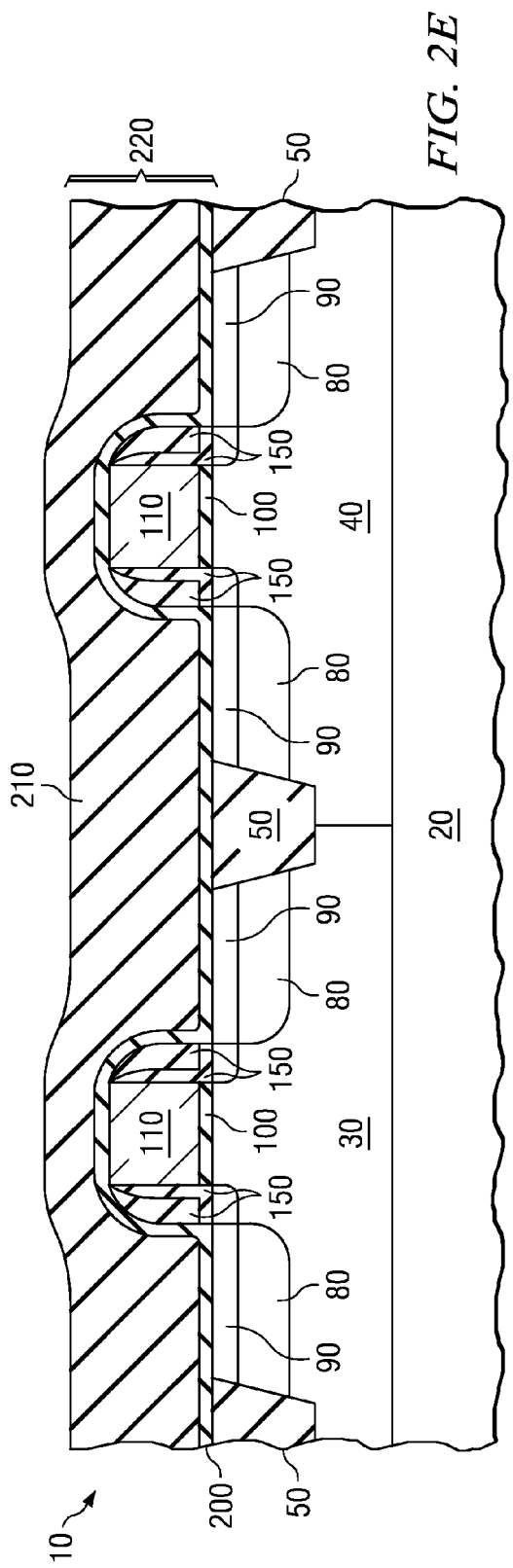
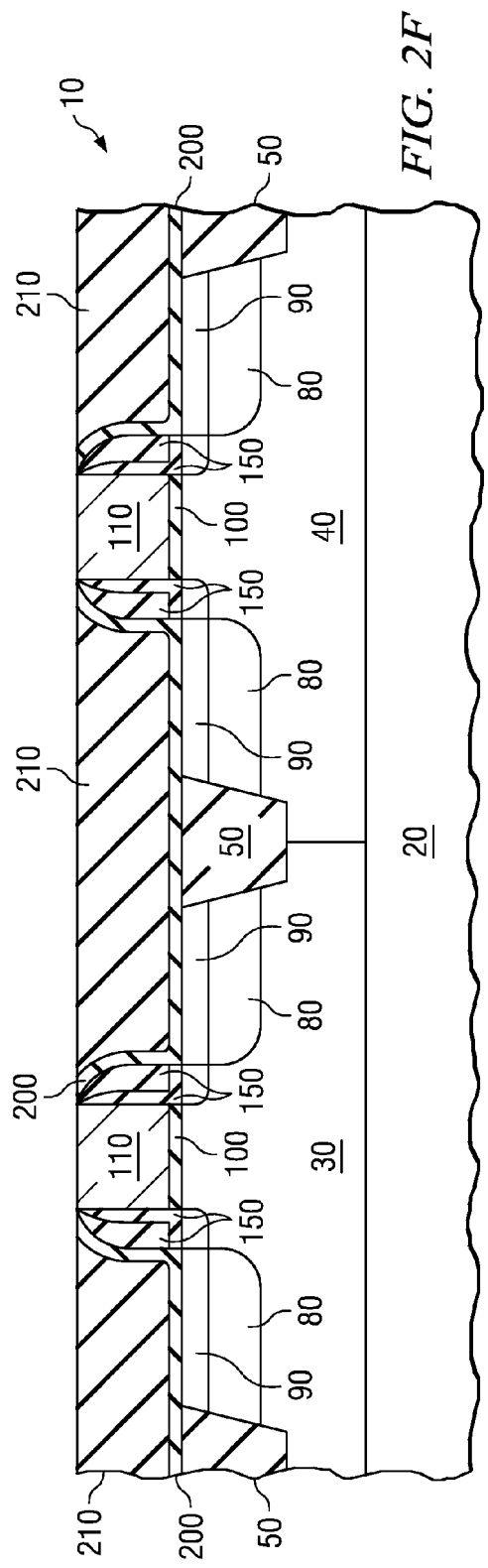

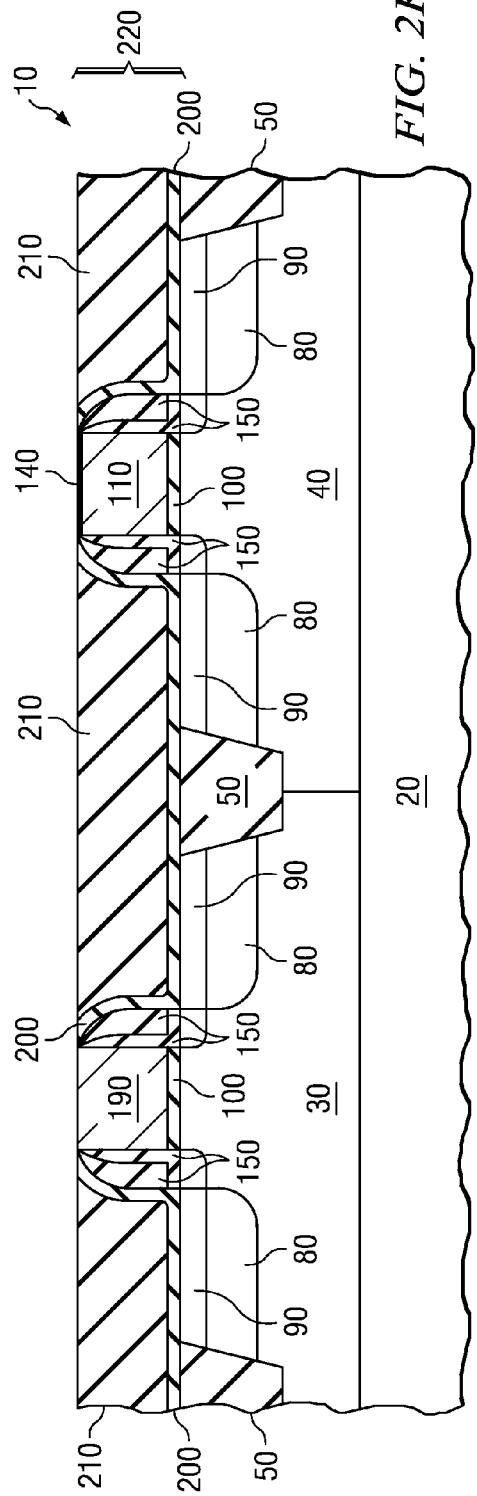
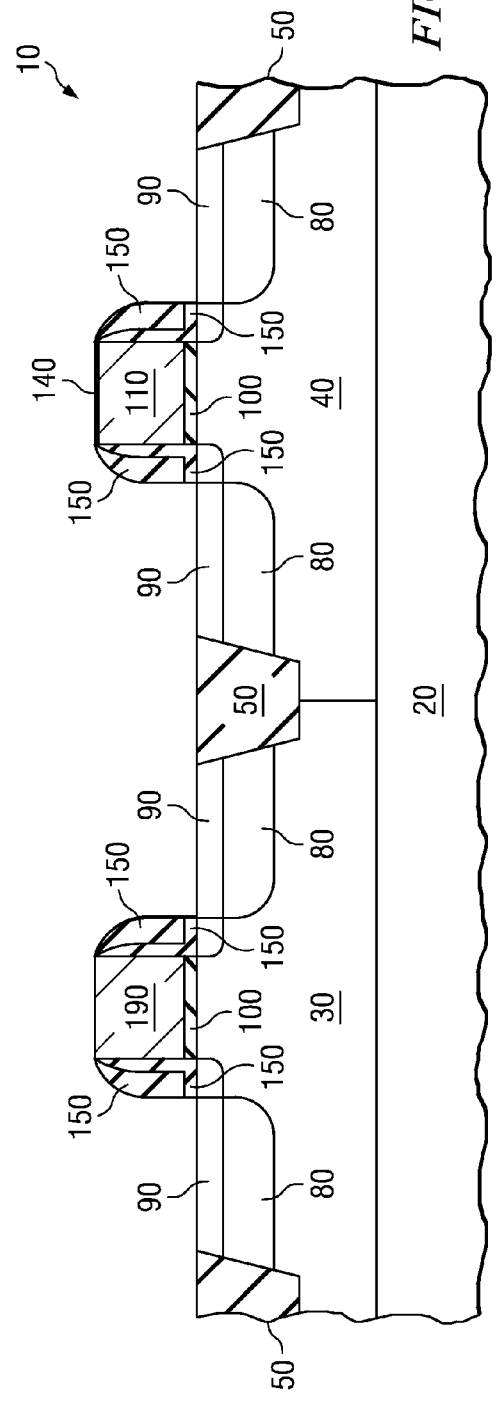

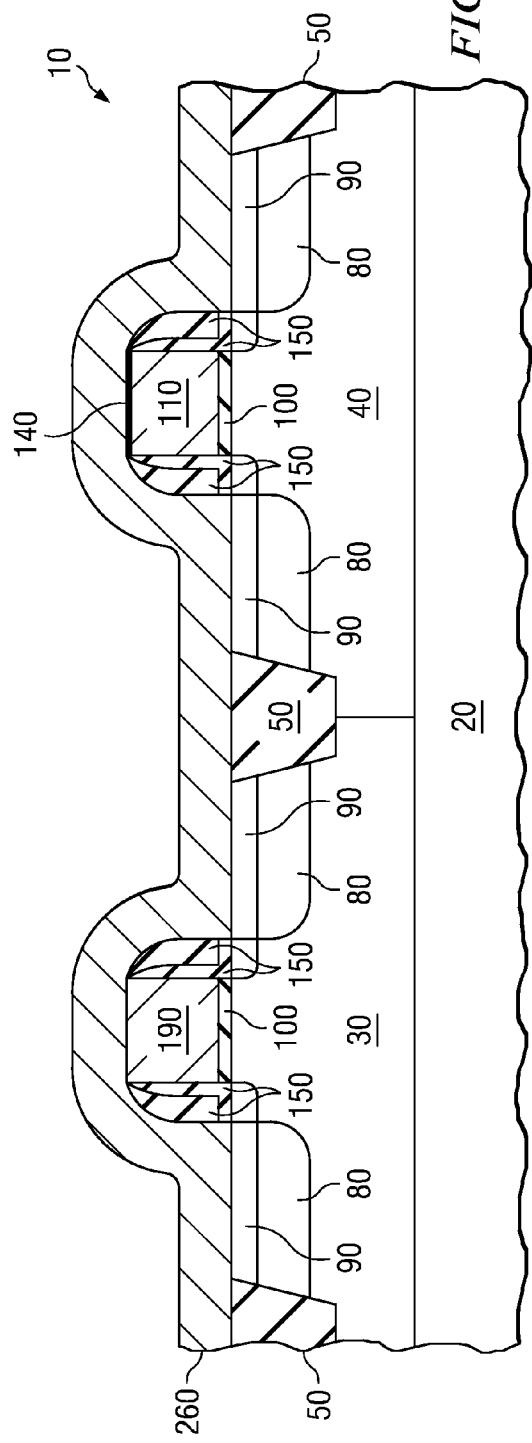

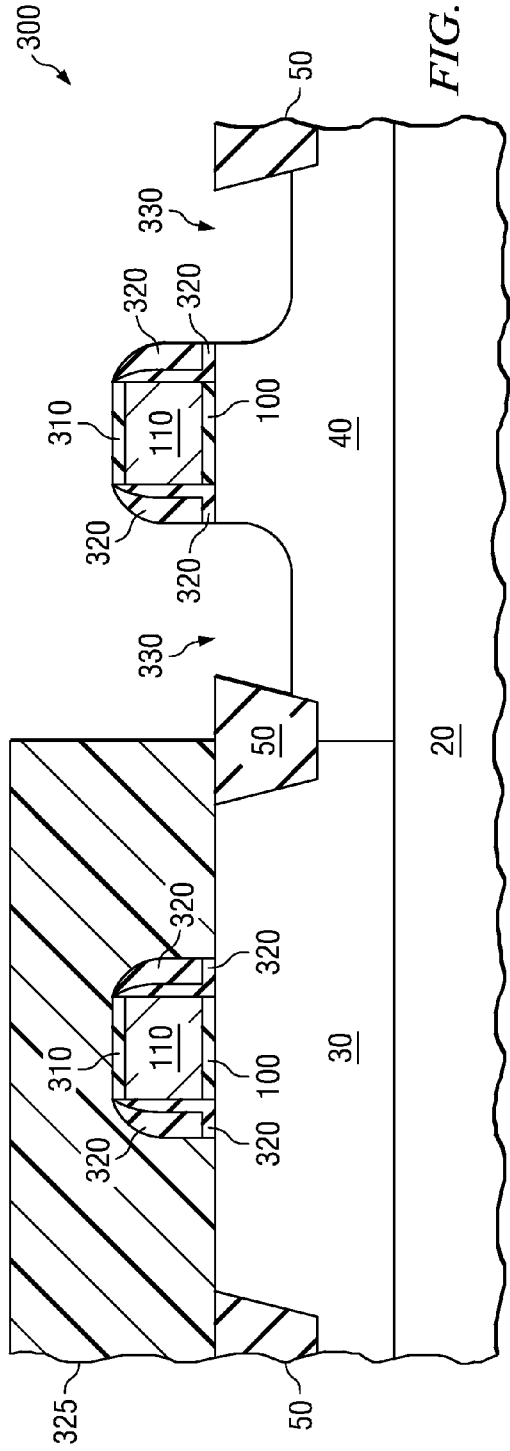
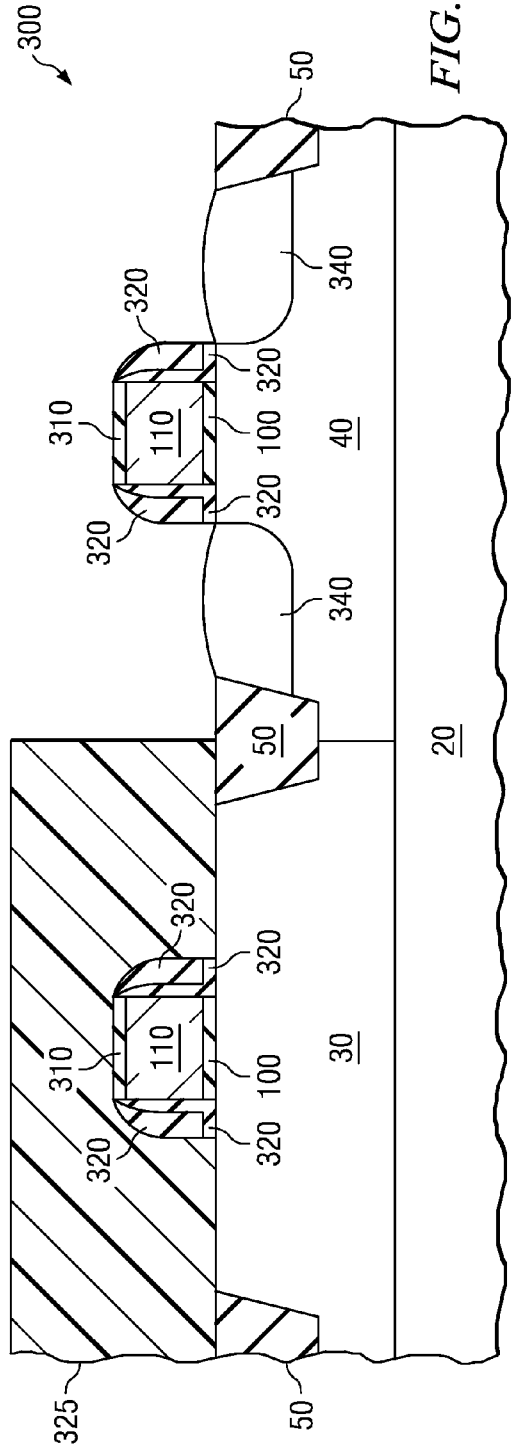

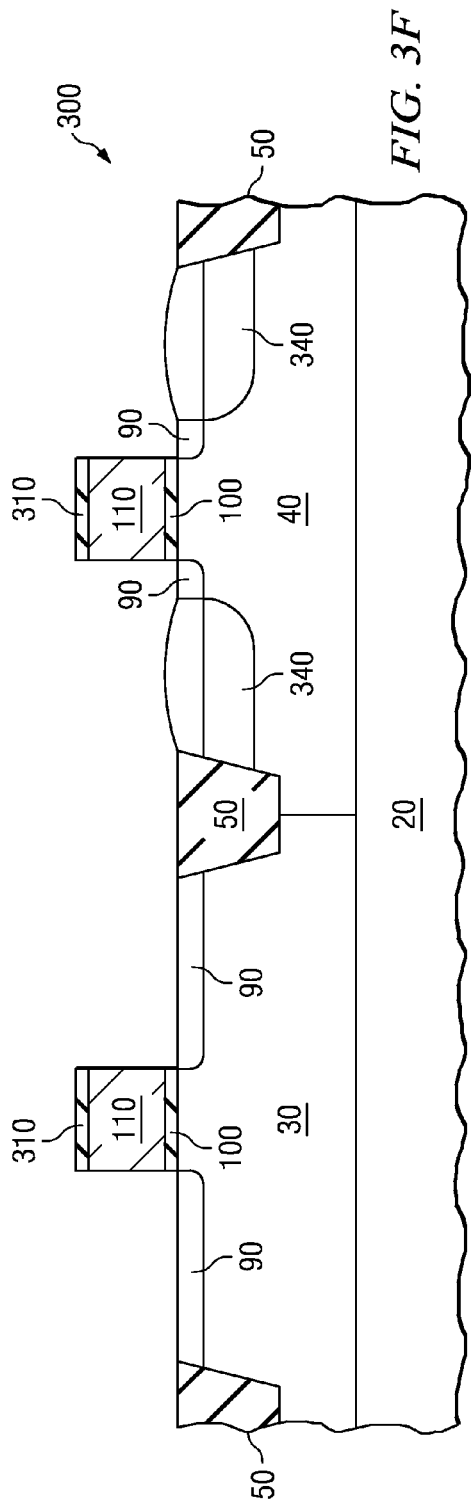
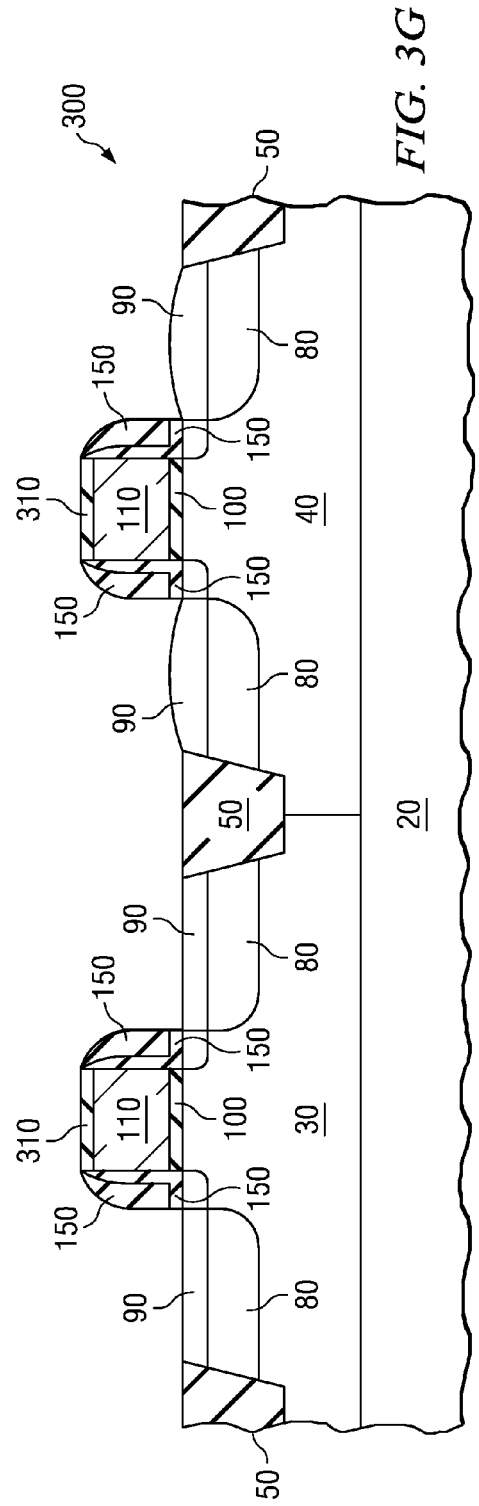

INTEGRATION SCHEME FOR AN NMOS METAL GATE

CROSS-REFERENCE TO RELATED APPLICATIONS

This is a division of application Ser. No. 11/934,250, filed on Nov. 2, 2007, the entire disclosure of which is hereby incorporated by reference.

BACKGROUND OF THE INVENTION

This invention relates to the fabrication of NMOS transistor metal gates for CMOS devices.

BRIEF DESCRIPTION OF THE DRAWINGS

FIGS. 3A-3H are cross-sectional diagrams of a process for forming a NMOS and a PMOS transistor in accordance with an alternative embodiment of the present invention.

DETAILED DESCRIPTION OF THE INVENTION

Figure 1:
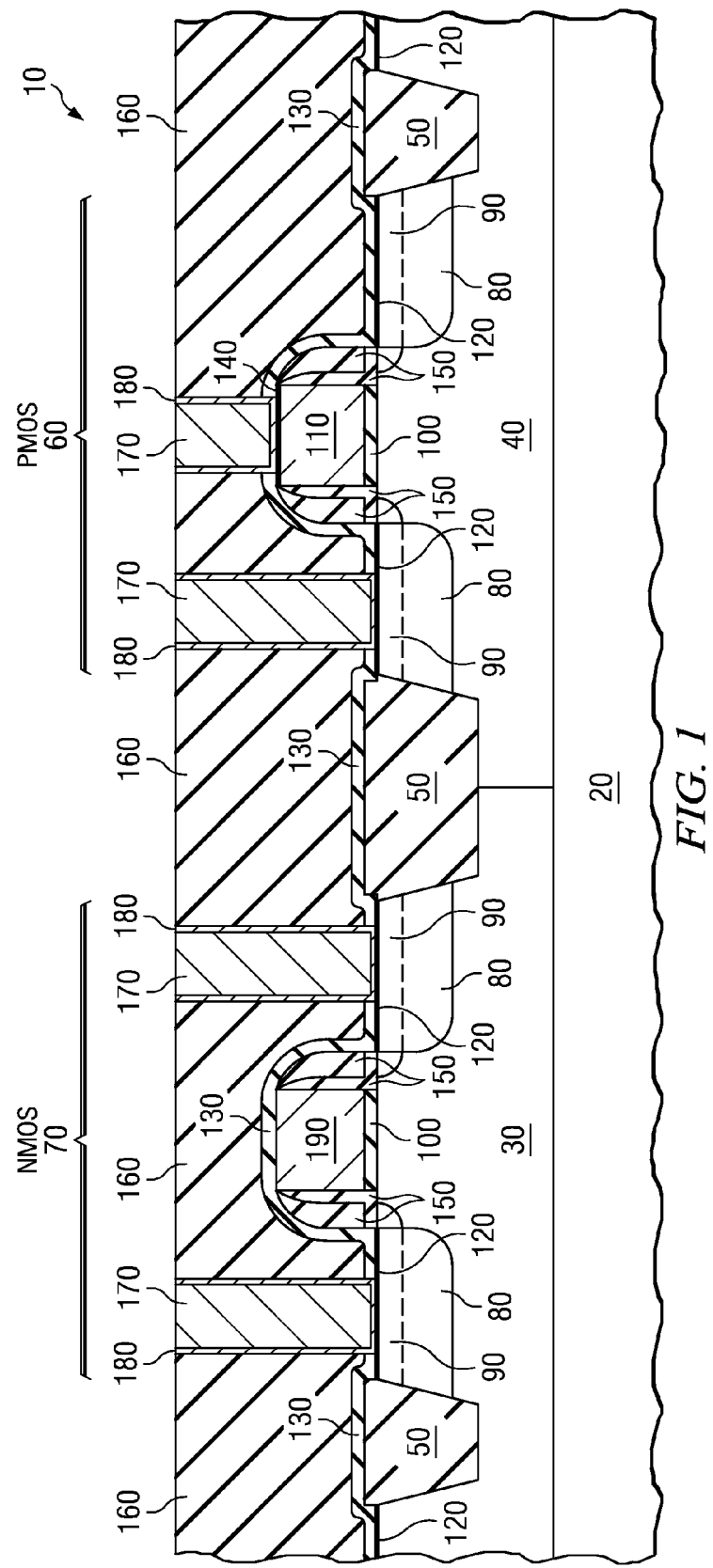
FIG. 1 is a cross-sectional view of a semiconductor structure in accordance with the present invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1 is a cross-sectional view of a semiconductor wafer 10 in accordance with a first embodiment of the present invention. In the example application, CMOS transistors 60, 70 are formed within a semiconductor substrate 20 having a p-well 30 containing the NMOS transistor 70 and an n-well 40 containing PMOS transistor 60.

The CMOS transistors 60, 70 are electrically insulated from other active devices located within the semiconductor wafer 10 (not shown) by shallow trench isolation structures 50 formed within the semiconductor substrate 20; however, any conventional isolation structure may be used such as field oxide regions or implanted isolation regions. The semiconductor substrate 20 may be a single-crystalline substrate that is doped with n-type and p-type dopants; however, it may also be silicon germanium ("SiGe") substrate, a silicon-on-insulator ("SOI") substrate, or a single-crystalline substrate having an epitaxial silicon layer that is doped with n-type and p-type dopants.

Transistors, such as CMOS transistors 60, 70, are generally comprised of a gate, source, and drain. More specifically, as shown in FIG. 1, the active portion of the CMOS transistors are comprised of source/drain regions 80, source/drain extension regions 90, and a gate stack that is comprised of a gate dielectric 100 and gate electrode 110, 190.

The example PMOS transistor 60 is a p-channel MOS transistor. Therefore it is formed within an n-well region 40 of the semiconductor substrate 20. In addition, the deep source/drain regions 80 and the extension regions 90 have p-type dopants, such as boron. The extension regions 90 may be lightly doped ("LDD"), medium doped ("MDD"), or highly doped ("HDD"). However, sources/drain regions 80 are usually heavily doped. In an alternative embodiment (described below), the PMOS source/drain regions 80 are formed with SiGe material.

The PMOS gate stack is initially comprised of a p-type doped polysilicon electrode 110 and gate dielectric 100. Subsequent fabrication steps (described below) will create a silicide layer 140 within the surface of the gate electrode 110 in the first embodiment of the present invention. The gate silicide 140 formed within the top surface of the gate electrode 110 is preferably nickel silicide or nickel platinum silicide; however, it is within the scope of the invention to fabricate the silicide 140 with other metals (such as cobalt, platinum, titanium, tantalum, molybdenum, tungsten, or alloys of these metals). The purpose of the gate silicide 140 formed within the gate electrode 110 is the reduction of the contact resistance between the PMOS transistor 60 and the electrical contacts 170, 180.

In an alternative embodiment (also described below) the PMOS polysilicon electrode 110 is converted to a fully silicided ("FUSI") gate electrode. The FUSI gate electrode 110 is preferably comprised of one of the phases of nickel silicide; however, other metals may be used, such as cobalt, platinum, titanium, tantalum, molybdenum, tungsten, or an alloy.

The example NMOS transistor 70 is an n-channel MOS transistor. Therefore it is formed within a p-well region 30 of the semiconductor substrate 20. In addition, the deep sources and drains 80 and the source and drain extensions 90 have n-type dopants such as arsenic, phosphorous, antimony, or a combination of n-type dopants. The extension regions 90 may be LDD, MDD, or HDD. However, sources/drain regions 80 are usually heavily doped. The NMOS gate stack is initially comprised of an n-type doped polysilicon electrode and gate dielectric 100. Subsequent fabrication (described below) replaces the initial polysilicon electrode with a metal gate electrode 190.

An offset structure comprising source/drain sidewalls 150 is used during fabrication to enable the proper placement of the source/drain regions 80. More specifically, the sources/drain regions 80 are formed with the gate stack and source/drain sidewalls 150 as a mask. The extension regions 90 are formed with the gate stack as a mask in the first embodiment. However, it is within the scope of the invention to form the extension regions 90 using the gate stack plus extension sidewalls that are located proximate the gate stack (not shown) as a mask.

In the first embodiment, the sources/drain regions 80 have a layer of silicide 120 that is formed within the top surface of the sources/drain regions 80 during the fabrication process. The silicide layer 120 formed within the top surface of the sources/drain regions 80 is preferably nickel silicide or nickel platinum silicide; however, it is within the scope of the invention to fabricate the silicide 120 with other metals (such as cobalt, platinum, titanium, tantalum, molybdenum, tungsten, or alloys of these metals). In the example application, the silicide layer 120 that is formed on the top surface of the sources/drain regions 80 is a self-aligned silicide (i.e. a "salicide"). The purpose of the silicide formed within the top portion of the sources/drain regions 80 is the reduction of the contact resistance between the transistors 60, 70 and the electrical contacts 170, 180.

A Pre-Metal Dielectric ("PMD") oxide layer 160 surrounds the transistors 60, 70. The composition of the PMD oxide layer 160 may be any suitable material such as $SiO_2$, tetraethylorthosilicate ("TEOS"), or organosilicate glass ("OSG"). The PMD oxide layer 160 electrically insulates the metal contacts 170 (and contact liners 180) that electrically connect the CMOS transistors 60, 70 to other active or passive devices (not shown) that are located throughout the semiconductor wafer 10. In the example application, a PMD nitride layer 130 is formed before the placement of the PMD oxide layer 160. The PMD nitride layer 130 may be any suitable material, such as silicon nitride, and it may be formed with any standard process such as chemical vapor deposition ("CVD"), plasma-enhanced chemical vapor deposition ("PECVD"), or low pressure chemical vapor deposition ("LPCVD").

In this example application, the contacts 170 are comprised of W; however, any suitable material (such as Cu, Ti, Al, or an alloy) may be used. In addition, an optional liner material 180 such as Ti, TiN, or Ta (or any combination or layer stack thereof) may be used to reduce the contact resistance at the interface between the contacts 170 and the selected gate electrodes 110, 190 or silicided sources/drain regions 80.

Subsequent fabrication will create the "back-end" portion of the integrated circuit (not shown). The back-end generally contains one or more interconnect layers that properly route electrical signals and power though out the completed integrated circuit.

In the example application shown in FIG. 1, the NMOS gate electrode 190 is comprised of metal while the PMOS gate electrode 110 is comprised of the original polysilicon material. Alternatively, the PMOS gate electrode 110 may be a fully silicided polysilicon gate electrode ("FUSI"). The use of a metal gate 190 in NMOS transistors 70 may improve transistor performance (through higher speed or lower leakage current) by reducing the depletion capacitance associated with the traditional doped polysilicon gate electrode of NMOS transistors.

In yet another alternative embodiment, PMOS transistor performance may be improved by using SiGe to form the source/drain regions 80 of the PMOS transistor, thereby causing compressive strain within the channel region of the PMOS transistor. In addition, PMOS transistor performance may also be improved by forming a compressive etch stop layer over the PMOS transistor to improve hole mobility. (Note that a patterned photoresist layer would be used to prevent the formation of the compressive etch stop layer over the NMOS transistor).

Figure 2G:
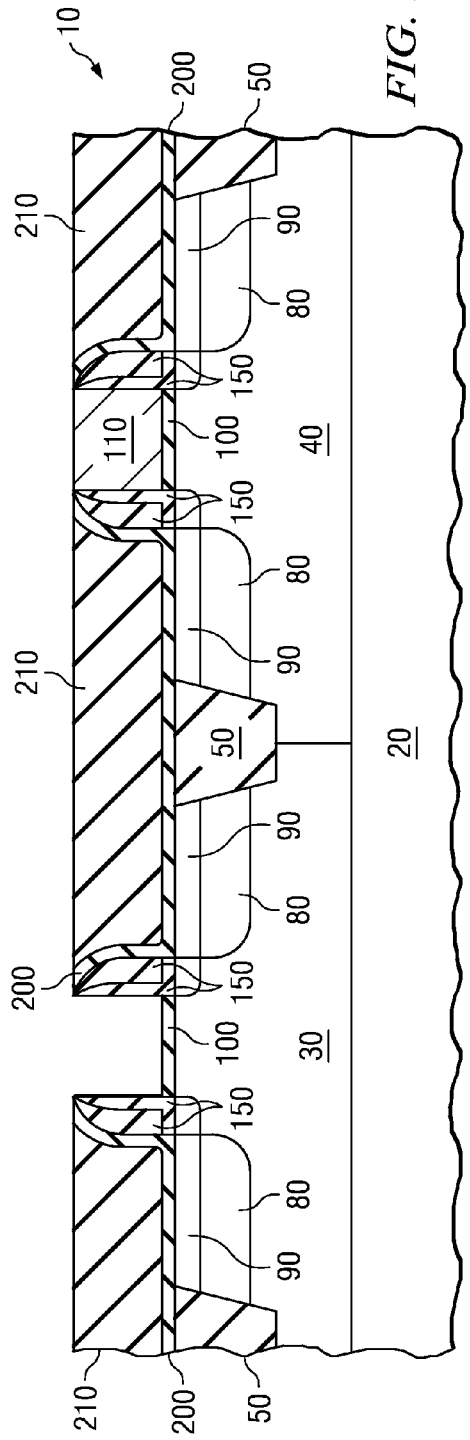
FIGS. 2A-2O are cross-sectional diagrams of a process for forming a NMOS and a PMOS transistor in accordance with the present invention.
Figure 2H:
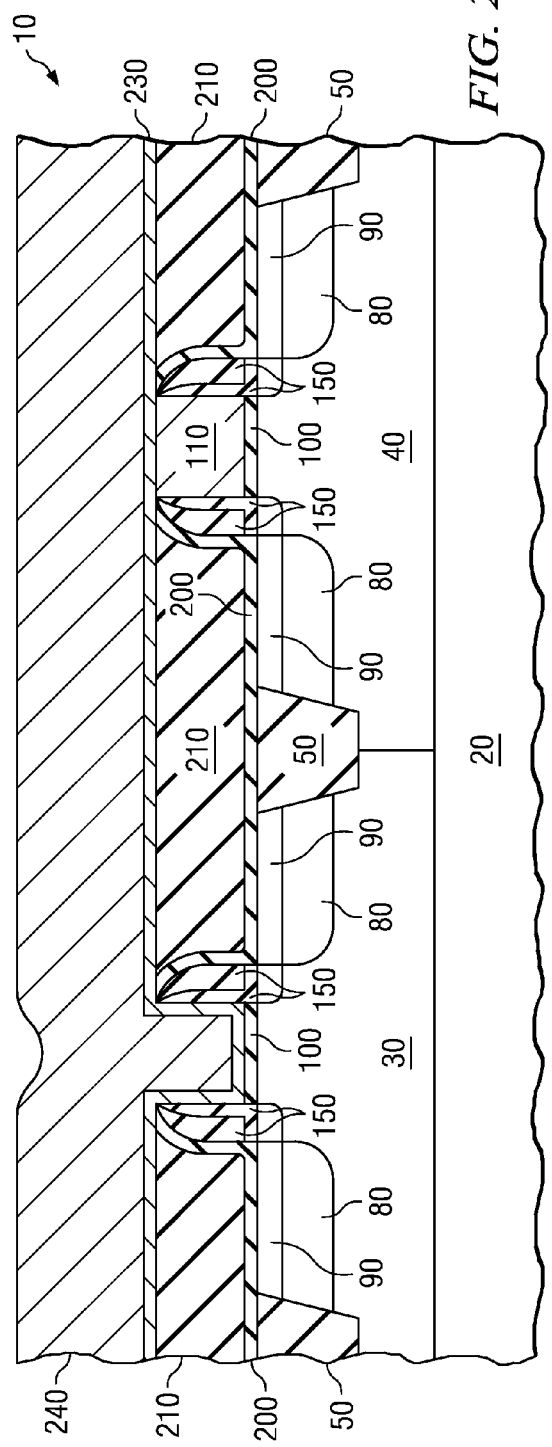
Figure 2I:
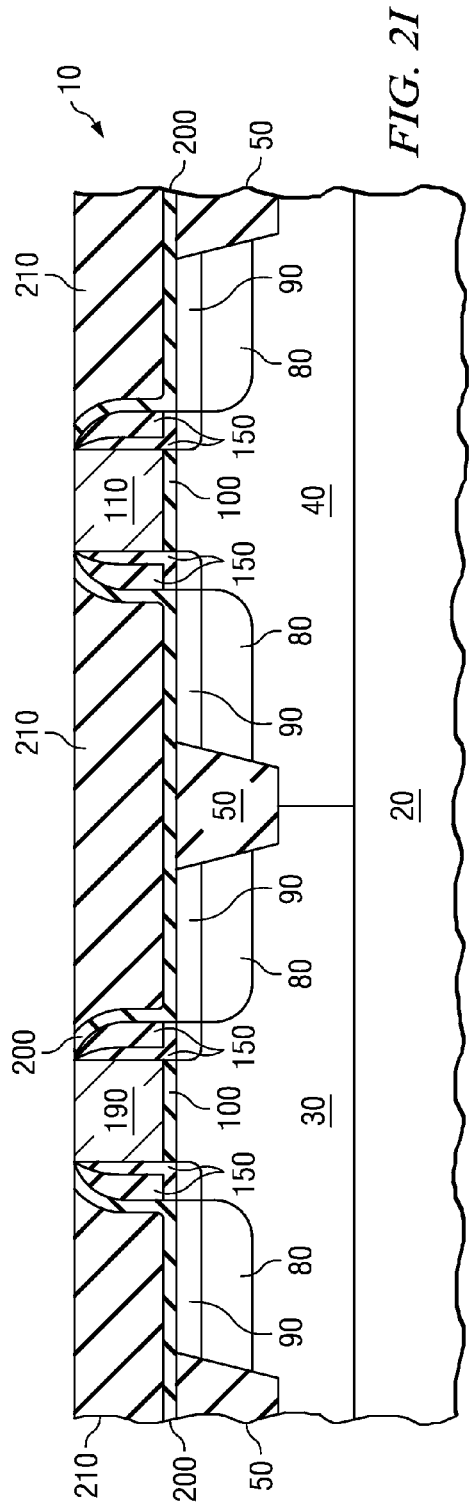
Figure 2J:
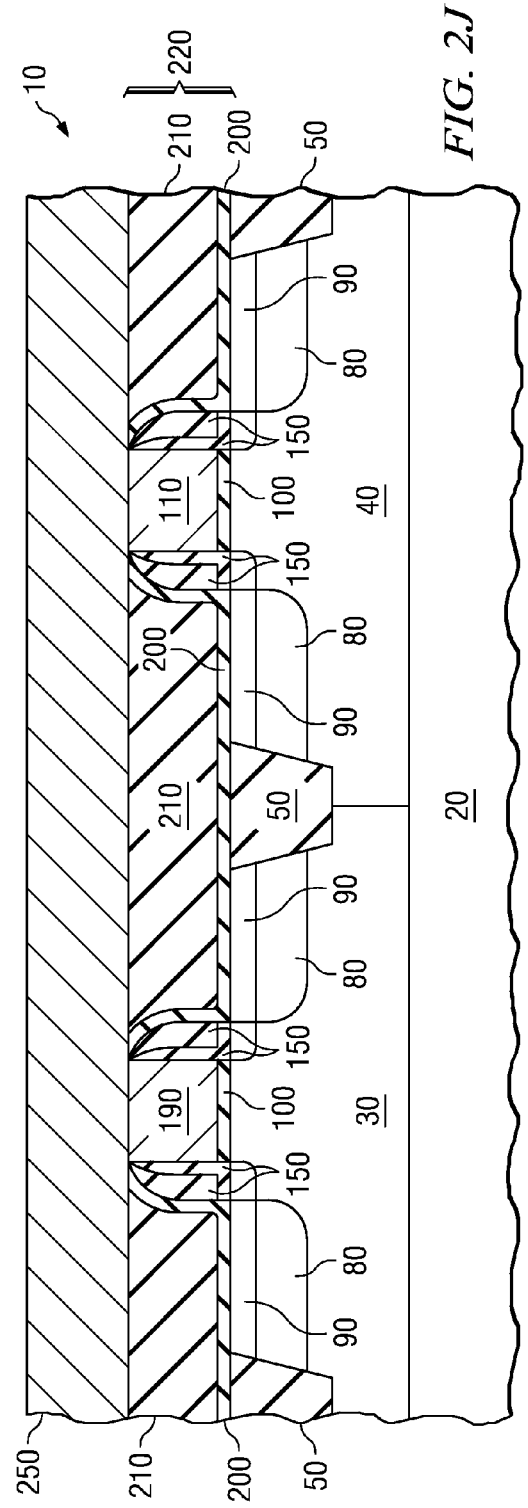
Figure 2O:
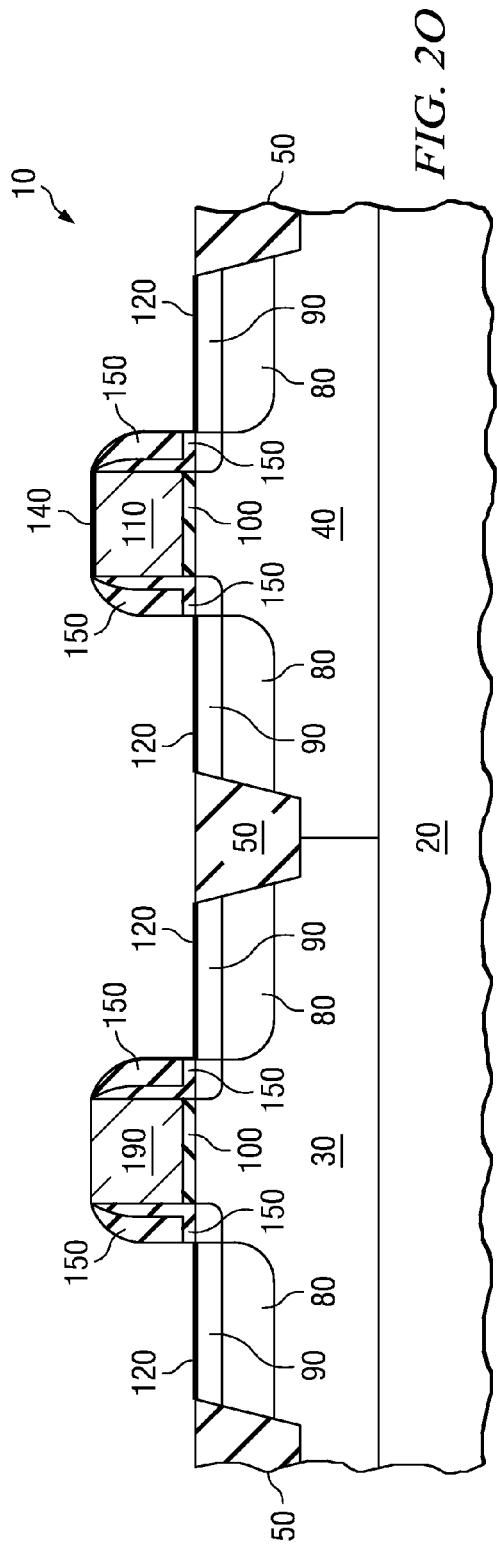

Referring again to the drawings, FIGS. 2A-2O are cross-sectional views of a partially fabricated semiconductor wafer 10 illustrating a process for forming an example PMOS transistor 60 and NMOS transistor 70 in accordance with the present invention. The following example application is exemplary but not restrictive of alternative ways of implementing the principles of the invention. Moreover, features and procedures whose implementations are well known to those skilled in the art are omitted for brevity. For example, the implementation of common fabrication steps lies within the ability of those skilled in the art and accordingly any detailed discussion thereof may be omitted.

FIG. 2A is a cross-sectional view of the semiconductor wafer 10 after the formation of the gate layer 105 and the gate polysilicon layer 115 on the top surface of a semiconductor substrate 20. In the example application, the semiconductor substrate 20 is silicon; however any suitable material such as germanium or gallium arsenide may be used. The semiconductor substrate 20 contains a p-well 30 for the NMOS transistor 70 and an n-well 40 for the PMOS transistor 60. In addition, the semiconductor substrate 20 contains shallow trench isolation structures 50 that are formed using any suitable standard process.

The gate dielectric layer 105 and the gate electrode polysilicon layer 115 are formed using well-known manufacturing techniques. The first layer formed over the surface of the semiconductor substrate 20 is a gate dielectric layer 105. As an example, the gate dielectric layer 105 is HfSiON that is 10-50 Å thick and it is formed using atomic layer deposition ("ALD") and subsequent thermal processes. However, the gate dielectric layer 105 may be any suitable material, such as $SiO_2$, SiON, $Si_3N_4$, $HfO_2$, $La_2O_3$, $Ta_2O_5$, or another high-k gate dielectric material. Furthermore, the gate dielectric layer 105 may be formed using any one of a variety of standard processes such as an oxidation, thermal nitridation, plasma nitridation, CVD, or physical vapor deposition ("PVD").

A gate electrode polysilicon layer 115 is then formed on the surface of the gate dielectric layer 105. The gate electrode layer 115 is comprised of polycrystalline silicon and it is 400-800 Å thick in the example application. However, it is within the scope of the invention to use other materials such as an amorphous silicon, a silicon alloy (e.g. SiGe), or other suitable materials. The gate electrode layer 115 may be formed using any standard process technique such as CVD or PVD. In addition, the gate polysilicon layer 115 may be any suitable thickness, such as 400-1500 Å.

After a pattern and etch process, a gate stack having a gate dielectric 100 and a gate electrode 110 will be formed from the gate layer 105 and the gate polysilicon layer 115 respectively. This gate stack, shown in FIG. 2B, may be created through a variety of processes. For example, the gate stack may be created by forming a layer of photoresist over the semiconductor wafer, patterning the photoresist, and then using the photoresist pattern to etch the gate polysilicon layer 115 and the gate layer 105. The gate stack is etched using any suitable etch process that is capable of etching polysilicon and oxide, such as an anisotropic plasma etch.

Generally, the next step is the formation of the extension regions 90 using the gate stack as a template, as shown in FIG. 2C. The extension regions 90 are formed near the top surface of the semiconductor substrate 20 using any standard process. For example, the extension regions 90 may be formed by low-energy ion implantation, gas phase diffusion, or solid phase diffusion. The dopants used to create the extension regions 90 for a PMOS transistor 120 are p-type (i.e. boron). In a separate fabrication step, the dopants used to create the extension regions 90 for a NMOS transistor 70 are n-type (i.e. phosphorous or arsenic). However, other dopants or combinations of dopants may be used.

Alternatively, extension sidewalls (not shown) may be formed on the outer surface of the gate stack and used (with the gate stack) as the mask to form the extension regions 90. If used, the extension sidewalls may be formed from a single material or may be formed from more than one layer of materials. For example, the extension sidewalls may be comprised of a silicon oxide, silicon oxi-nitride, silicon nitride, or any other dielectric material or layers of dielectric materials.

The material layers for the extension sidewalls may be formed with any suitable process, such as thermal oxidation, or deposition by ALD, CVD, or PVD. Preferably, at least one layer of the extension sidewall is comprised of silicon nitride.

At some point after the implantation of the extension regions 90, the extension regions 90 are activated by an anneal process (performed now or later). This anneal step may be performed with any suitable process such as rapid thermal anneal ("RTA").

It is within the scope of the embodiment to also form halo implant regions within the p-well 30 and the n-well 40 (not shown). The optional halo implants (sometimes called "pocket implants" or "punch through stoppers" because of their ability to stop punch through current) may be formed with any standard implant or diffusion process within (or proximate to) the extension regions 90.

Referring to FIG. 2D, source/drain sidewalls 150 are now formed proximate to the gate stack (or to the extension sidewalls, if used). The source/drain sidewalls 150 may be formed using any standard process and materials. The example source/drain sidewalls 150 may be comprised of a cap silicon oxide and a silicon nitride layer that are formed with a CVD process and subsequently anisotropically etched (preferably using standard anisotropic plasma etch processes). However, it is within the scope of the invention to use more layers (i.e. a spacer oxide layer, a silicon layer, and a final oxide layer) or less layers (i.e. just a silicon oxide layer or a silicon nitride layer) to create the source/drain sidewalls 150. It is to be noted that the semiconductor wafer 10 is usually subjected to a standard post-etch cleaning process after the formation of the source/drain sidewalls 150.

Now the source/drain sidewalls 150 (and the gate stack) are used as a template for the implantation of dopants into the source/drain regions 80 shown in FIG. 2D. The source/drain regions 80 may be formed through any one of a variety of processes, such as high dose ion implantation.

The dopants used to create the source/drain regions 80 for a PMOS transistor 60 are typically boron; however, other p-type dopants or combinations for dopants may be used. It is to be noted that the source/drain dopant implantation step may cause p-type dopants to be implanted into the polysilicon gate electrode 110 of the PMOS transistor 60. In addition, p-type dopants may be implanted into the polysilicon gate electrode 110 of the PMOS transistor 60 during the prior implantation of the extension regions or in a separate implantation process.

In a separate fabrication step, the source/drain regions 80 for the NMOS transistor 70 are implanted. The dopants used to create the NMOS source/drain regions 80 are typically phosphorous or arsenic; however, other n-type dopants or combinations for dopants may be used. The NMOS source/drain dopant implantation step may cause n-type dopants to also be implanted into the polysilicon gate electrode 110 of the NMOS transistor 70. In addition, n-type dopants may be implanted into the polysilicon gate electrode 110 of the NMOS transistor 60 during the prior implantation of the extension regions or in a separate implantation process. Alternatively, the polysilicon gate electrode 110 of the NMOS transistor 60 may remain undoped through the use of standard masking manufacturing techniques, such as the use of a patterned photoresist or a hardmask located over the NMOS gate electrode 110 during each of the dopant implantation steps described.

After the dopants are implanted, the source/drain regions 80 are activated by an anneal step. (However, the anneal of the extension region and the source/drain region may be combined and performed together at this point in the fabrication process.) This anneal step acts to repair the damage to the semiconductor wafer and to activate the dopants. The activation anneal may be performed by any suitable technique such as RTA (including spike anneal), flash lamp annealing ("FLA"), laser annealing, or a combination thereof. This anneal step often causes lateral and vertical migration of dopants in the extension regions 90 and the sources/drain regions 80 (not shown). In addition, this anneal step will cause the recrystallization of the ion implant areas 80, 90 (or the full crystallization of the ion implant areas 80, 90 if this is the first anneal).

As shown in FIG. 2E, the next step is the conformal deposition of a PMD layer 220 over the semiconductor wafer 10. In the example application, the PMD layer has two components, namely, the PMD nitride layer 200 and the PMD oxide layer 210. (The PMD nitride layer 200 is sometimes called a contact etch stop layer because it is often used to protect the transistor from a subsequent fabrication step where contact holes are etched in the overlaying PMD oxide layer 160 before forming the contacts 170, 180.) Preferably, the PMD nitride layer 200 is $Si_3N_4$; however, any other suitable material such as bis-t-butylaminosilane ("BTBAS") may be used. In the example application, the PMD nitride layer 200 is between 150-300 Å thick and it is formed using a standard PECVD deposition process. However, the PMD nitride layer 200 may have any suitable thickness between 100-350 Å.

The PMD oxide layer 210 is deposited over the PMD nitride layer 200. The PMD oxide layer 210 is preferably TEOS; however, other dielectric materials such as OSG may be used. In the example application, the PMD oxide layer 210 is between 500-2000 Å thick and it is formed using a standard PECVD deposition process. However, the PMD nitride layer 200 may have any suitable thickness between 1000-3000 Å.

A standard Chemical Mechanical Polish ("CMP") is now performed. As shown in FIG. 2F, the CMP continuously planarizes both the PMD oxide layer 210 and the PMD nitride layer 200 until the polysilicon electrodes 110 of the PMOS 60 and NMOS 70 transistors are exposed. However, it is within the scope of the invention to use a suitable alternative processes to expose the polysilicon electrodes 110 of the PMOS 60 and NMOS 70 transistors. For example, one or more blanket dry etch processes may be used to reduce the thicknesses of the PMD oxide layer 210 and the PMD nitride layer 200, thereby exposing the polysilicon gate electrodes 110 of the PMOS 60 and NMOS 70 transistors.

As shown in FIG. 2G, the exposed polysilicon gate electrode 110 of the NMOS transistor 70 is now removed. In the example application, the polysilicon gate electrode 110 of the NMOS transistor 70 is removed with a wet etch process that uses an etch chemistry that is selective to the PMOS gate electrode 110 (which is p-doped). Specifically, an ammonium hydroxide solution ($NH_4OH:H_2O$) at a temperature between 25-80° C. is used to etch the undoped or n-doped polysilicon gate electrode 110 of the NMOS transistor with minimal loss of the polysilicon gate electrode 110 of the PMOS transistor. It is to be noted that the $NH_4OH:H_2O$ etch is also selective to the gate dielectric 100; therefore, the majority of the original NMOS gate dielectric layer 100 remains.

The next step in the fabrication process is the formation of a metal gate electrode within the NMOS transistor 70. As noted supra, the use of a metal gate 190 in NMOS transistors 70 may improve the NMOS transistor performance by minimizing the depletion capacitance associated with the doped gate polysilicon of NMOS transistors. In the example application, the NMOS transistor metal gate 190 is formed from a NMOS-metal layer and a fill-metal layer. As shown in FIG. 2H, a conformal NMOS-metal layer 230 is initially formed over the semiconductor substrate 20. The NMOS-metal layer 230 is preferably comprised of Ta; however, other suitable materials such as Hf, HfSi, or an alloy may be used. In addition, the NMOS-metal layer 230 is preferably is between 10-50 Å thick and it is formed using a standard PVD deposition process. However, the NMOS-metal layer 230 may be any suitable thickness between 10-200 Å and it may be formed with other standard processes, such as CVD and ALD.

A thicker conformal fill-metal layer 240 is subsequently formed over the NMOS-metal layer 230 using any standard process, such as CVD. The fill-metal layer 240 is preferably comprised of Al; however, other suitable materials such as W or an alloy may be used. In addition, the fill-metal layer 240 is preferably between 200-1000 Å thick; however, the fill-metal layer 240 may be any suitable thickness between 100-1000 Å.

Once the NMOS-metal layer 230 and the fill-metal layer 240 have been formed, a standard CMP process is used to remove metal layers 230 and 240 from all areas of the semiconductor wafer 10 except the NMOS gate electrode location. The resulting NMOS gate electrode 190, shown in FIG. 2I, is essentially comprised of metal liner 230 and metal fill 240. The fabrication of the semiconductor wafer 10 now continues (using standard process steps) until the semiconductor device is complete. Generally, the next step is the formation of the gate silicide of the PMOS transistor 60 using a gate silicide process loop, as outlined below.

As shown in FIG. 2J, a metal layer 250 is now formed over the semiconductor wafer 10. The metal layer 250 is preferably comprised of nickel platinum; however, other suitable materials such as nickel, cobalt, platinum, titanium, tantalum, molybdenum, tungsten, or an alloy may be used. In the example application, the metal layer 250 is designed to silicide the top portion of the PMOS polysilicon gate electrode 110. Therefore, the thickness of the gate metal layer 250 is dependant on the target depth of the PMOS gate silicide 140.

An optional capping layer (not shown) may also be formed over the metal layer 250. If used, the capping layer acts as a passivation layer that prevents the diffusion of oxygen from ambient into the metal layer 250. The capping layer may be any suitable material, such as TiN or Ti. In addition, the optional capping layer may be between 50-300 Å thick.

In accordance with the invention, the semiconductor wafer 10 is now annealed with any suitable process, such as a RTA. This anneal will cause the metal layer 250 to react with the PMOS polysilicon gate electrode 110 and thereby form a silicide layer 140 within the top surface of the polysilicon gate electrode 110. In the example application, the silicide anneal is performed for 10-60 seconds at a temperature between 300-500° C. It is to be noted that the metal layer 250 will not react with the sources/drains 80 because they are protected from silicidation by the previously formed PMD layer 220.

The next step is the removal of the un-reacted portions of the silicidaton metal layer 250, as shown in FIG. 2K. The metal layer 250 (and the capping layer, if used) is removed with any suitable process such as a selective wet etch process (i.e. using a fluid mixture of sulfuric acid, hydrogen peroxide, and water).

It is within the scope of the invention to perform another silicide anneal (such as another RTA) at this point in the manufacturing process in order to further react the gate silicide 140. In the example application, the second silicide anneal is performed for 30-120 seconds at a temperature between 400-600° C. The second silicide anneal will ensure the formation of a NiSi having a lowered sheet resistance.

In the example embodiment, the next step in the manufacturing process is the performance of the source/drain silicide loop. The purpose of the source/drain silicide loop is the creation of a source/drain silicide 120 on the top surfaces of the source/drain regions 80. The semiconductor wafer 10 is prepared for the silicide loop by removing the etch stop layer 220 to expose the surfaces of the source/drain regions 80, as shown in FIG. 2L.

The first step of the source/drain silicide loop is the deposition of a metal layer 260 over the top surface of the semiconductor wafer 10, as shown in FIG. 2M. The metal layer 260 is preferably comprised of NiPt; however, other suitable materials such as Ni, Co, Pt, Ti, Ta, Mo, W, or their alloys may be used. In the example application, the silicidation metal layer 260 is between 40-100 Å thick and is formed using a PVD process.

An optional capping layer (not shown) may also be formed over the metal layer 260. If used, the capping layer acts as a passivation layer that prevents the diffusion of oxygen from ambient into the metal layer 260. The capping layer may be any suitable material, such as TiN, and may be between 50-300 Å thick.

The second step of the source/drain silicide loop is an anneal. The semiconductor wafer 10 may be annealed with any suitable process, such as RTA. In the example application, the silicide anneal is performed for 10-60 seconds at a temperature between 300-500° C. This anneal process will cause a silicide 120 to form over all active silicon surfaces that are in contact with the metal layer 260; namely, the surface of the source/drain regions 80. These silicide regions 120 are shown in FIG. 2N.

It is to be noted that the metal layer 260 will only react with the active substrate (i.e. exposed Si); namely, the source/drain regions 80. Therefore, the source/drain silicide 120 formed by this annealing process will be a salicide. It is also to be noted that the gate electrodes 190 and 110 were not modified by the source/drain silicide loop anneal because the NMOS gate electrode 190 is already comprised of metal, and PMOS gate electrode 110 was protected from the metal layer 260 by the gate silicide 140 and the source/drain sidewalls 150.

The third step in the source/drain silicide loop is the removal of the un-reacted metal layer 260, as shown in FIG. 2O. The un-reacted metal layer 260 (and the capping layer, if used) is removed using any suitable process such as a wet etch process (i.e. using a fluid mixture of sulfuric acid, hydrogen peroxide, and water).

The fourth step of the source/drain silicide loop is the performance of a second anneal (such as another RTA) to further react the source/drain silicide 120 with the source/drain regions 80. In the example application, a second silicide anneal is performed for 10-60 seconds at a temperature between 400-600° C. If the initial anneal process of the silicide loop did not complete the silicidation process, this second anneal will ensure the formation of a source/drain silicide 120 having a lowered sheet resistance.

It is within the scope of the invention to perform the source/drain silicide loop before the gate silicide loop instead of performing the source/drain silicide loop after the gate silicide loop, as discussed supra. It is also within the scope of the invention to perform one silicide loop that simultaneously forms both the source/drain silicide and the gate silicide. If the source/drain silicide loop and the gate silicide loop are performed together than the thickness of the source/drain silicide 120 and the gate silicide 140 will be similar because the thickness of the metal layer used for the combined silicide process is determinative of the depth of the final silicide structures.

The fabrication of the semiconductor wafer 10 now continues (using standard process steps) until the semiconductor device is complete. Referring again to FIG. 1, the next step is generally the formation of the PMD layer 220 comprising the final PMD nitride liner 130 and the final PMD oxide layer 160 using the processes described supra (see FIG. 2E). However, PMD layer may be created with any suitable materials and number of layers.

The contacts 170 are formed by etching the PMD layers 130, 160 to expose the desired gate, source and/or drain. The etched spaces are usually filled with a liner 180 to improve the electrical interface between the silicide and the contact 170. Then contacts 170 are formed within the liner 180; creating the electrical interconnections between various semiconductor components located within the semiconductor substrate 20.

As discussed above, the fabrication of the final integrated circuit continues with the fabrication of the back-end structure. Once the fabrication process is complete, the integrated circuit will be tested and then packaged.

Alternative processes that incorporate the replacement of the NMOS polysilicon gate electrode with a metal gate electrode are also within the scope of the invention. For example, in a first alternative embodiment the PMOS transistor performance may be improved by forming SiGe source/drain regions 80, as described infra. In a second alternative embodiment, the PMOS transistor performance may be improved by forming a FUSI gate electrode 110 in addition to forming SiGe source/drain regions 80, also described infra.

Figure 3A:
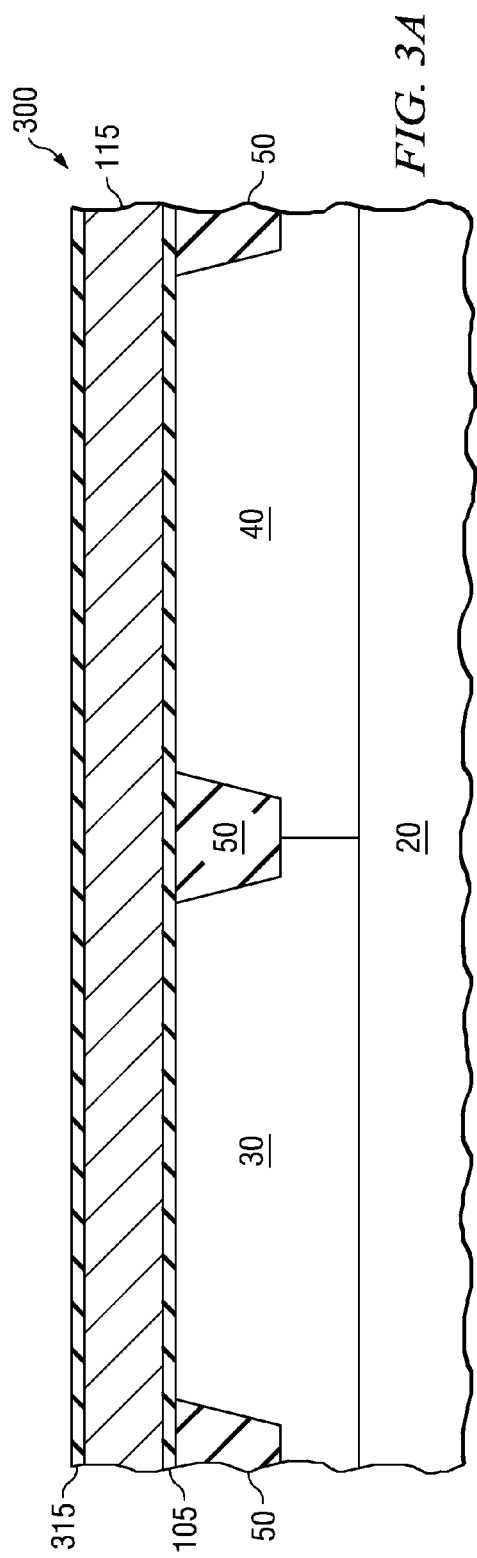

FIGS. 3A-3H are cross-sectional views of a partially fabricated semiconductor wafer 300 illustrating a portion of the process for forming an example PMOS transistor 60 and NMOS transistor 70 in accordance with the first alternative embodiment of the present invention. As shown in FIG. 3A, a hardmask 315 layer is formed on the surface of the gate electrode layer 115 in the first alternative embodiment. The gate hardmask layer 315 is comprised of silicon dioxide (SiO$_2$) in the example application. However, it is within the scope of the invention to use other materials such as SiON, Si$_3$N$_4$, SiON, SiC, TEOS, plasma tetra Ethyl Oxysilane ("PTEOS"), or a combinational stack of these materials. Preferably, the gate hardmask layer 315 is formed with a rapid thermal chemical vapor deposition ("RTCVD") process using silane or dichlorosilane and ammonia precursors; however, any suitable process may be used. In addition, the gate hardmask layer 315 may be any suitable thickness, such as 50-600 Å. The purpose of the gate hardmask layer 315 is to protect the polysilicon gate electrodes 110 during the formation of the SiGe source/drain regions.

Figure 3B:
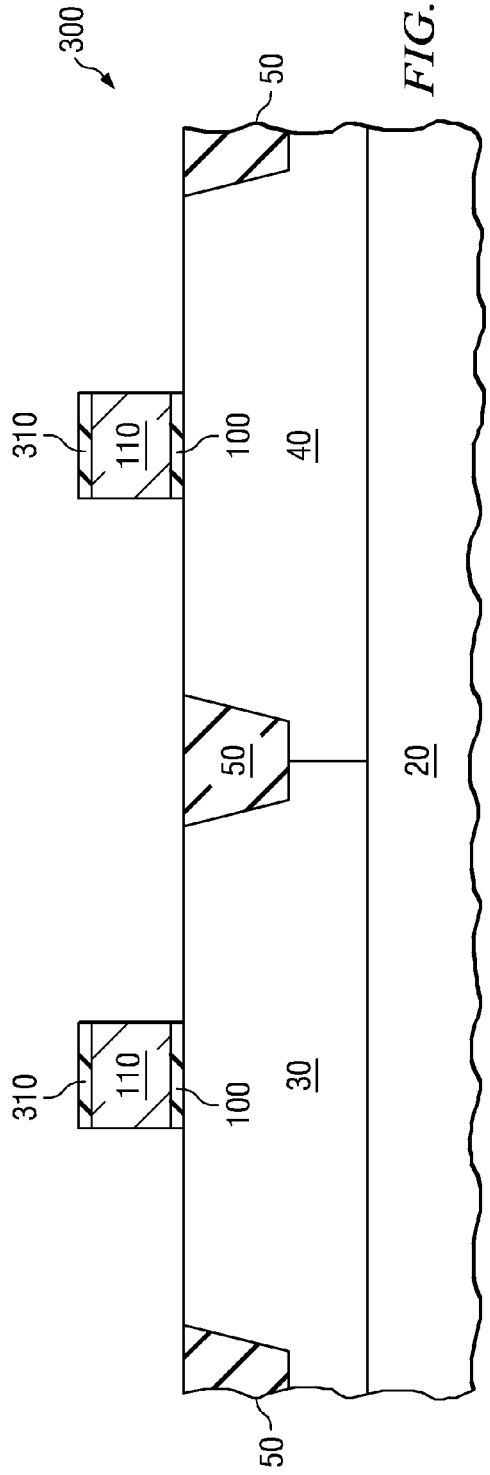
Figure 3C:
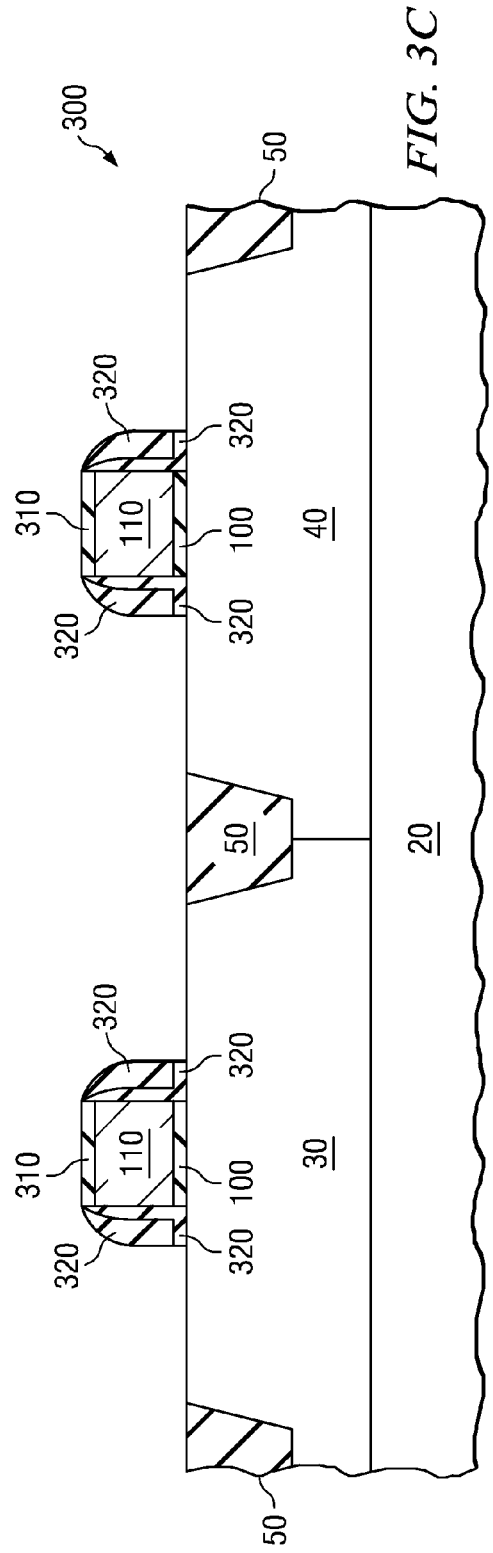

As shown in FIG. 3B, the gate stack will include a hardmask layer 310 on the surface of the gate electrode 110 after the patterned etch step. The next step in the first alternative embodiment is the formation a temporary sidewall on the gate stack in preparation for the subsequent recess etch step. Preferably, a thermal oxidation process is performed in order to grow an oxide layer (about 20-40 Å thick). Then a nitride layer (about 100-200 Å thick) is formed over the oxide layer using a CVD process. The oxide and nitride layers are subsequently anisotropically etched to form the temporary sidewalls 320 shown in FIG. 3C. However, it is within the scope of the invention to form temporary sidewalls 320 having more or less than the two layers described. For example, the temporary sidewalls 320 may be comprised of just the initial oxide layer formed by a thermal oxidation process.

A patterned photoresist layer 325 is now formed over the NMOS transistor area 70. The photoresist layer 325 protects the NMOS transistor 70 from the recess etch of the PMOS source/drain regions. Once the patterned photoresist 325 is in place, a standard recess etch process is used to create the trenches 330 in the source/drain areas of the PMOS transistor 60, as shown in FIG. 3D. Depending on the target shape of the final source/drain regions, the recess etch may be either an isotropic etch, an anisotropic etch, or a combination of both (i.e. an isotropic etch will undercut the temporary sidewalls 320, thereby removing more of the material comprising the n-well region 40).

As shown in FIG. 3E, SiGe regions 340 are formed within the trenches 330 of the PMOS transistor 60. The SiGe regions 340 may be formed with any standard process, such as RTCVD, ultra-high vacuum chemical vapor deposition ("UHCVD"), or molecular beam epitaxy ("MBE").

Once the SiGe deposition process is complete, the patterned photoresist 320 is removed using a standard ash and clean process, as shown in FIG. 3F. Next, the temporary sidewalls 320 are also removed with a standard wet etch or plasma etch process. The gate stacks are now used as a mask for the implantation of the extension regions 90 of the PMOS transistor 60 and the NMOS transistor 70, as also shown in FIG. 3F.

The fabrication of the semiconductor wafer 300 now continues with the formation of the source/drain sidewalls 150 and the implantation of the source/drain regions 80, as shown in FIG. 3G. The source/drain sidewalls are formed using any suitable materials and with any suitable process, such as those described supra (see FIG. 2D). Upon formation of the source/drain sidewalls 150, the source/drain regions 80 are implanted with any suitable process—such as high dose ion implantation—and then the source/drain regions are annealed. It is to be noted that the source/drain regions may be implanted to the same depth as the SiGe layer 340, as shown in FIG. 3G, or the source/drain implant may be performed to a different depth than the boundary of the SiGe layer 340.

Figure 3H:
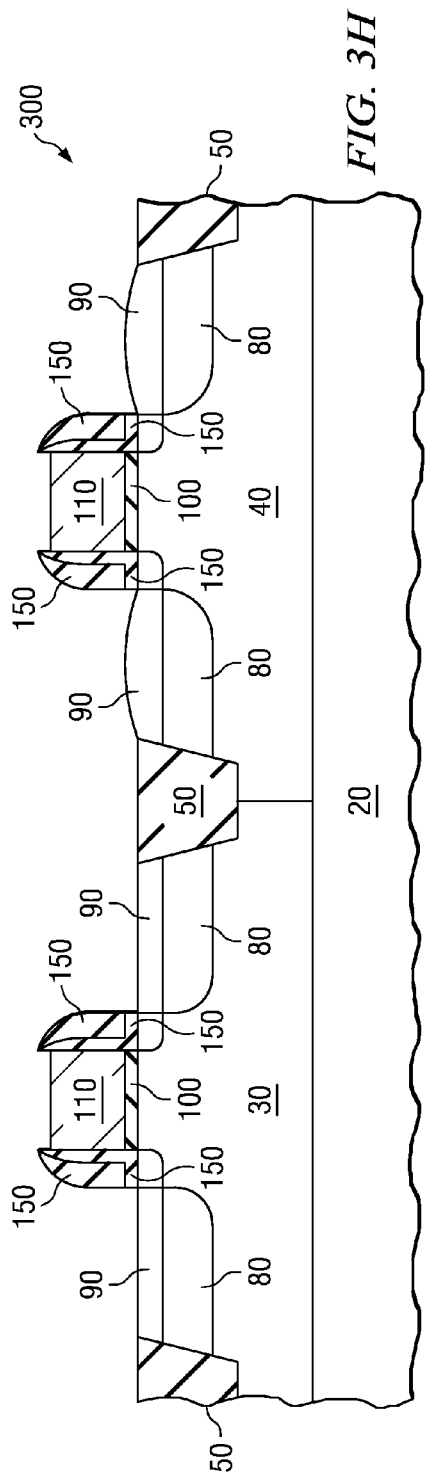

Next, as shown in FIG. 3H, the gate hardmask layers 310 are removed from the PMOS transistor 60 and the NMOS transistor 70. In the example application, the gate hardmask 310 is removed by a wet etch using a dilute HF solution. However, any suitable process may be used to remove the gate hardmask 310, such as a wet etch using buffered HF or a dry etch using anhydrous HF. The fabrication process then continues with the steps shown in FIGS. 2E-2O and described supra.

Figure 4A:
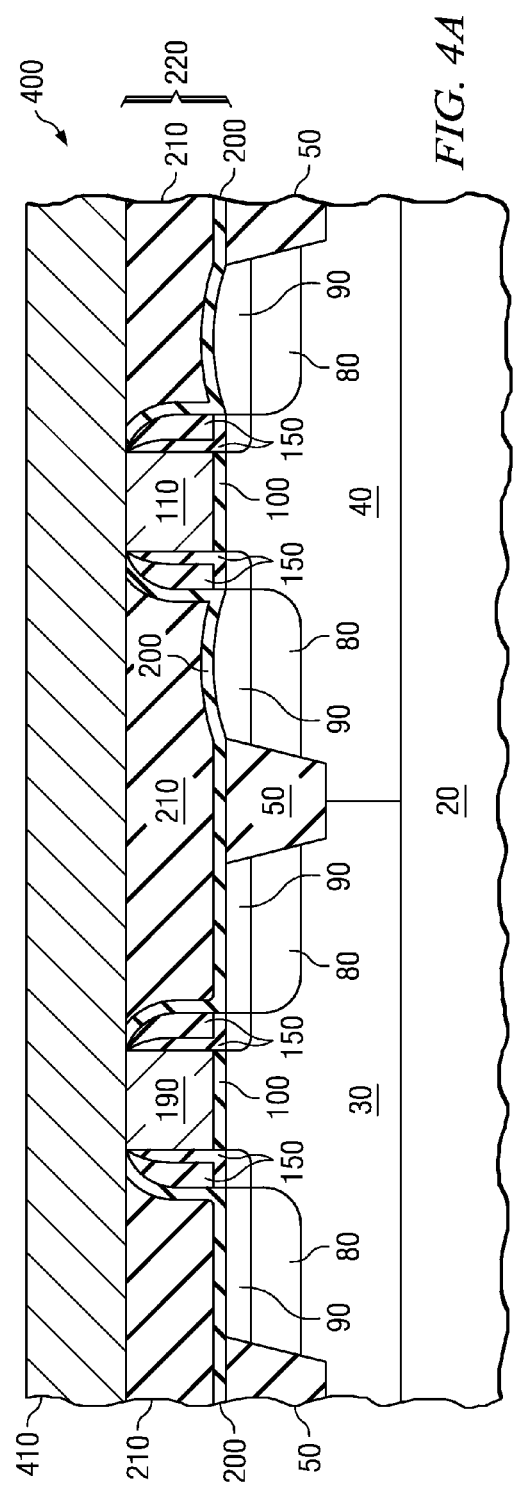
FIGS. 4A-4B are cross-sectional diagrams of a process for forming a NMOS and a PMOS transistor in accordance with another alternative embodiment of the present invention.
Figure 4B:
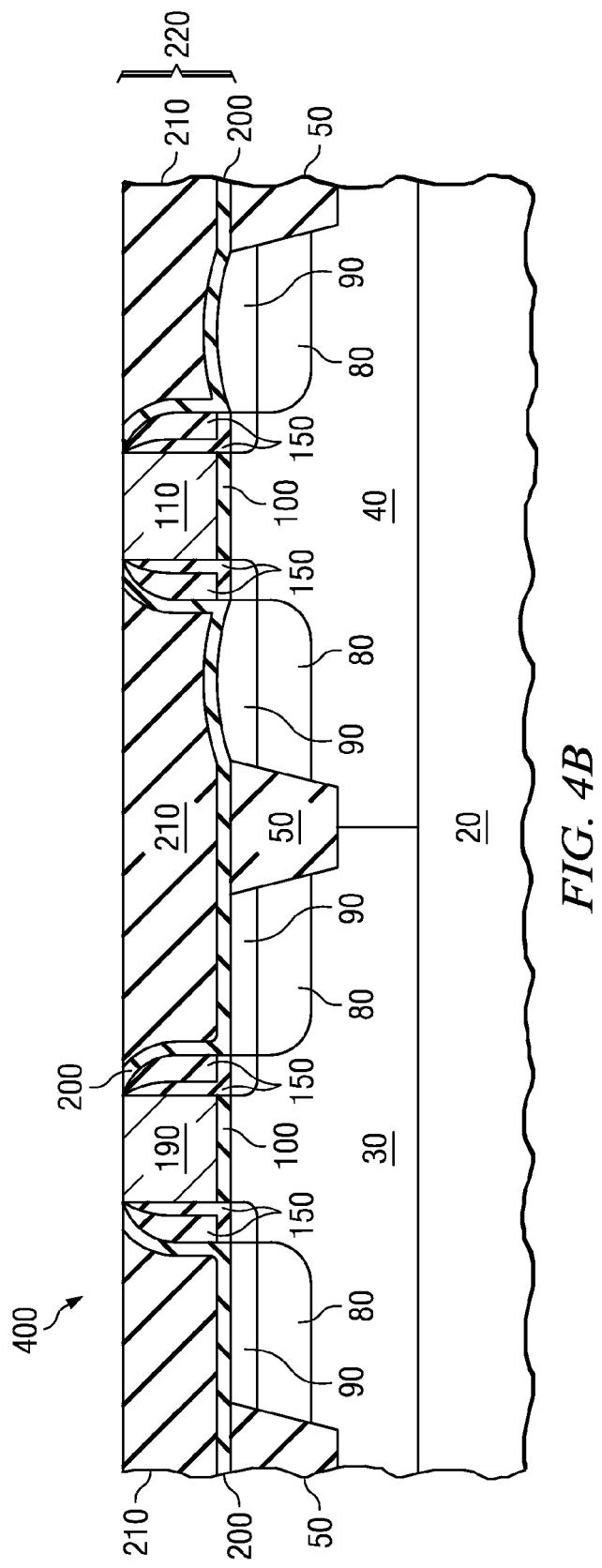

FIGS. 4A-4B are cross-sectional views of a partially fabricated semiconductor wafer 300 illustrating a portion of the process for forming an example PMOS transistor 60 and NMOS transistor 70 in accordance with the second alternative embodiment of the present invention. In the example application described above (FIGS. 2J-2K) a gate silicide layer 140 was formed within the surface of the polysilicon gate electrode 110 of the PMOS transistor 60. In the second alternative embodiment, the polysilicon gate electrode 110 of the PMOS transistor is fully silicided instead of partially silicided. A fully silicided PMOS gate electrode 110 may improve the performance of the PMOS transistor because a FUSI gate electrode has reduced poly depletion. As shown in FIG. 4A, a silicidation metal layer 410 is formed over the semiconductor substrate 20 after the formation of SiGe source/drain regions 80 and the formation of the NMOS metal gate electrode 190. The silicidation metal layer 410 is designed to fully silicide the PMOS polysilicon electrode 110. In addition, the metal layer 410 is removed upon completion of the standard gate silicide loop, as shown in FIG. 4B. The fabrication of semiconductor wafer 400 then continues with the steps shown in FIGS. 2L-2O and described supra.

Various additional modifications to the invention as described above are within the scope of the claimed invention. As an example, interfacial layers may be formed between any of the layers shown. In addition, any of the implant processes may be followed by a post ion implantation clean. Furthermore, an anneal process may be performed after any step in the above-described fabrication process. When used, the anneal process can improve the microstructure of materials and thereby improve the quality of the semiconductor structure. Additionally, if a metal other than NiPt is used then higher temperatures may be required for the described silicide anneal processes. Moreover, in the second alternative embodiment a standard etch may be performed to reduce the height of the PMOS gate electrode 110 before the gate silicide loop is performed. This optional step of reducing the height of the PMOS gate electrode 110 facilitates the formation of a nickel-rich nickel platinum silicide in the PMOS transistor 60, thereby further increasing the work function of the final FUSI gate electrode 110.

It is also within the scope of the claimed invention to perform the fabrication steps in an alternative order. For example, the gate silicide loop or the source/drain silicide loop may be performed before the formation of the metal gate electrode 190 within the NMOS transistor 70.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for making an NMOS transistor and a PMOS transistor, comprising:
   providing a semiconductor substrate containing an NMOS transistor and a PMOS transistor, wherein said NMOS transistor includes:
      a gate dielectric coupled to said semiconductor substrate;
      a polysilicon gate electrode coupled to said gate dielectric;
      extension regions within said semiconductor substrate;
      source/drain sidewalls coupled to said gate electrode;
      source/drain regions within said semiconductor substrate; and
      a pre-metal dielectric layer coupled to said gate electrode, said source/drain sidewalls, and said source/drain regions;
   further wherein said PMOS transistor includes:
      a gate dielectric coupled to said semiconductor substrate;
      a polysilicon gate electrode coupled to said gate dielectric and doped with p-type dopant;
      source/drain sidewalls coupled to said gate electrode;
      source/drain regions within said semiconductor substrate, said source/drain regions comprising SiGe; and
      a pre-metal dielectric layer coupled to said gate electrode, said source/drain sidewalls, and said SiGe source/drain regions;
   reducing a thickness of said pre-metal dielectric layer to expose said gate electrode of said NMOS transistor and said gate electrode of said PMOS transistor;
   with said gate electrodes of both said NMOS and PMOS transistors exposed, selectively removing said gate electrode of said NMOS transistor without removing said gate electrode of said PMOS transistor using a wet etch chemistry that is selective to polysilicon doped with the p-type dopant;
   with said gate electrode of said NMOS transistor removed, depositing an NMOS-metal layer over said semiconductor substrate including between said source/drain sidewalls of said NMOS transistor;
   depositing a fill-metal layer over said NMOS-metal layer including between said source/drain sidewalls of said NMOS transistor; and
   reducing a thickness of said NMOS-metal layer and said fill-metal layer to expose said gate electrode of said PMOS transistor and to leave portions of said NMOS-metal layer and said fill-metal layer in replacement for said gate electrode of said NMOS transistor.

2. The method of claim 1, wherein said step of selectively removing said gate electrode of said NMOS transistor includes using $NH_4OH:H_2O$.

3. The method of claim 1, wherein said NMOS-metal layer comprises Ta and said fill-metal layer comprises Al.

4. The method of claim 1, further comprising a step of forming a gate silicide within said gate electrode of said PMOS transistor.

5. The method of claim 4, wherein said step of forming a gate silicide forms a fully silicided gate electrode.

6. The method of claim 1, further comprising:
   removing remaining portions of said pre-metal dielectric layer overlying said source/drain regions of said NMOS transistor and said Si/Ge source/drain regions of said PMOS transistor; and
   forming a source/drain silicide within said source/drain regions of said NMOS transistor and said SiGe source/drain regions of said PMOS transistor.

7. The method of claim 1, wherein said pre-metal dielectric layer comprises a nitride layer and an oxide layer.

8. The method of claim 1, wherein said p-type dopant is boron;
   and said wet etch chemistry comprises $NH_4OH:H_2O$.

9. A method for making an integrated circuit including NMOS and PMOS transistors, comprising:
   forming p-type and n-type well regions in a semiconductor substrate;
   forming a first gate stack over the p-type well region and a second gate stack over the n-type well region, the gate stacks having a top and including a layer comprising silicon formed over a first dielectric layer;
   forming sidewalls on sides of the gate stacks;
   selectively implanting p-type dopant into the n-type well region and into the layer comprising silicon of the second gate stack;
   forming a second dielectric layer conformally over the p-type and n-type well regions including over the top of the first and second gate stacks, the second dielectric layer having a thickness less than combined thicknesses of the layer comprising silicon and the first dielectric layer;
   forming a third dielectric layer over the second dielectric layer over the p-type and n-type well regions including over the top of the first and second gate stacks, to thickness above a level of the top of the gate stacks;
   planarizing the second and third dielectric layers down to the level of the top of the gate stacks, thereby exposing the layer comprising silicon in the first and second gate stacks;

with said layer comprising silicon in the second gate stack left exposed, selectively removing the layer comprising silicon in the first gate stack leaving an opening between the sidewalls of the first gate stack, in a wet etch process using an etch chemistry selective to the p-type dopant implanted layer comprising silicon of the second gate stack and to the dielectric layer, leaving unremoved the p-type dopant implanted layer comprising silicon in the second gate stack and the dielectric layer in the first and second gate stacks;

forming a first metal layer over the p-type and n-type well regions including over the planarized second and third dielectric layers, over the exposed layer comprising silicon of the first gate stack, and conformally within the opening, the first metal layer having a thickness less than the thickness of the removed layer comprising silicon;

forming a second metal layer over the first metal layer to a level above the level of the top of the first and second gate stacks, with portions of the first and second metal layers filling the opening; and planarizing the first and second metal layers down to the level of the top of the first and second gate stacks, leaving the portions filling the opening;

whereby the portions of the first and second metal layers filling the opening at least partially define an NMOS transistor gate electrode in replacement of the layer comprising silicon in the second gate stack, and wherein the p-doped layer comprising silicon remaining in the first gate stack at least partially defines a PMOS transistor gate electrode.

10. The method of claim 9, wherein the layer comprising silicon comprises polysilicon, the second dielectric layer comprises a nitride, the third dielectric layer comprises an oxide, and the etch chemistry comprises an ammonium hydroxide solution.

11. The method of claim 10, wherein the p-type dopant comprises boron.

12. The method of claim 9, wherein selectively implanting the p-type dopant includes one or both of forming extension regions or forming source/drain regions in the n-type well region.

13. The method of claim 9, further comprising selectively implanting n-type dopant into one or both of the p-type well region and the layer comprising silicon of the first gate stack.

14. The method of claim 9, wherein the gate stacks are formed to include a hardmask layer above the layer comprising silicon; the substrate is selectively etched to form trenches in the n-type well region adjacent the second gate stack; and the trenches are filled with stress inducing material prior to forming the sidewalls and prior to selectively implanting the p-type dopant.

15. The method of claim 9, wherein at least a portion of the silicon of the p-doped layer comprising silicon remaining in the first gate stack is transformed to a silicide.

16. A method for making an integrated circuit including NMOS and PMOS transistors, comprising:

forming p-type and n-type well regions in a silicon substrate;

forming a first gate stack over the p-type well region and a second gate stack over the n-type well region, the gate stacks having a top and including a polysilicon layer formed over a first dielectric layer;

forming sidewalls on sides of the gate stacks;

selectively implanting boron into the n-type well region and into the polysilicon layer of the second gate stack;

forming a second dielectric layer conformally over the p-type and n-type well regions including over the top of the first and second gate stacks, the second dielectric layer having a thickness less than combined thicknesses of the polysilicon layer and the first dielectric layer;

forming a third dielectric layer over the second dielectric layer over the p-type and n-type well regions including over the top of the first and second gate stacks, to thickness above a level of the top of the gate stacks;

planarizing the second and third dielectric layers down to the level of the top of the gate stacks, thereby exposing the polysilicon layer in the first and second gate stacks;

with the boron implanted polysilicon layer in the second gate stack left exposed, selectively removing the polysilicon layer of the first gate stack leaving an opening between the sidewalls of the first gate stack, in a wet etch process using an etch chemistry including ammonium hydroxide solution selective to the boron implanted silicon layer of the second gate stack and to the dielectric layer, leaving unremoved the boron implanted silicon layer in the second gate stack and the dielectric layer in the first and second gate stacks;

forming a first metal layer over the p-type and n-type well regions including over the planarized second and third dielectric layers, over the exposed silicon layer of the first gate stack, and conformally within the opening, the first metal layer having a thickness less than the thickness of the removed silicon layer;

forming a second metal layer over the first metal layer to a level above the level of the top of the first and second gate stacks, with portions of the first and second metal layers filling the opening;

planarizing the first and second metal layers down to the level of the top of the first and second gate stacks, leaving the portions filling the opening; and siliciding at least a portion of the boron-doped silicon layer in the second gate stack;

whereby the portions of the first and second metal layers filling the opening at least partially define an NMOS transistor gate electrode in replacement of the silicon layer in the second gate stack, and wherein the silicided boron-doped silicon layer remaining in the first gate stack at least partially defines a PMOS transistor gate electrode.

17. The method of claim 16, wherein the substrate is selectively etched to form trenches in the n-type well region adjacent the second gate stack; and the trenches are filled with stress inducing material prior to forming the sidewalls and prior to selectively implanting the boron.

* * * * *